United States Patent
Zhang et al.

(10) Patent No.: US 11,965,124 B2
(45) Date of Patent: Apr. 23, 2024

(54) QLED AND MANUFACTURING METHOD THEREOF

(71) Applicant: TCL TECHNOLOGY GROUP CORPORATION, Guangdong (CN)

(72) Inventors: Jie Zhang, Guangdong (CN); Chaoyu Xiang, Guangdong (CN)

(73) Assignee: TCL TECHNOLOGY GROUP CORPORATION, Guangdong (CN)

( * ) Notice: Subject to any disclaimer, the term of this patent is extended or adjusted under 35 U.S.C. 154(b) by 375 days.

(21) Appl. No.: 17/419,674

(22) PCT Filed: Sep. 17, 2019

(86) PCT No.: PCT/CN2019/106137
§ 371 (c)(1),
(2) Date: Jun. 29, 2021

(87) PCT Pub. No.: WO2020/134203
PCT Pub. Date: Jul. 2, 2020

(65) Prior Publication Data
US 2022/0081313 A1    Mar. 17, 2022

(30) Foreign Application Priority Data
Dec. 29, 2018 (CN) .......................... 201811639181.7

(51) Int. Cl.
*C09K 11/88* (2006.01)
*B82Y 20/00* (2011.01)
(Continued)

(52) U.S. Cl.
CPC .......... *C09K 11/883* (2013.01); *C09K 11/565* (2013.01); *H10K 50/115* (2023.02);
(Continued)

(58) Field of Classification Search
CPC .................................................. H10K 50/115
See application file for complete search history.

(56) References Cited

U.S. PATENT DOCUMENTS 9,385,194 B2   7/2016  Cho et al.
10,103,345 B2 * 10/2018 Yoon ..................... H10K 50/115
(Continued)

FOREIGN PATENT DOCUMENTS

CN     103059868 A    4/2013
CN     104927843 A    9/2015
(Continued)

OTHER PUBLICATIONS

International Search Report for International Application No. PCT/CN2019/106137; Application Filing Date: Sep. 17, 2019; dated Nov. 29, 2019, 6 pages, with English Translation.
(Continued)

*Primary Examiner* — Daniel P Shook
(74) *Attorney, Agent, or Firm* — CANTOR COLBURN LLP

(57) ABSTRACT

The present application discloses a QLED manufacturing method, which includes following steps of: providing a substrate provided with a bottom electrode, and preparing a quantum dot light emitting layer on the substrate; illuminating after depositing a first compound solution on a surface of the quantum dot light emitting layer, here a first compound is a compound capable of being photodegraded into ions after the illumination.

20 Claims, 2 Drawing Sheets

(51) Int. Cl.
    *C09K 11/56*     (2006.01)
    *H10K 50/115*     (2023.01)
    *B82Y 35/00*     (2011.01)
    *B82Y 40/00*     (2011.01)
    *H10K 50/16*     (2023.01)
    *H10K 71/00*     (2023.01)

(52) U.S. Cl.
    CPC ............. *B82Y 20/00* (2013.01); *B82Y 35/00* (2013.01); *B82Y 40/00* (2013.01); *H10K 50/16* (2023.02); *H10K 71/00* (2023.02)

(56) References Cited

U.S. PATENT DOCUMENTS

| | | |
|---|---|---|
| 10,113,109 B2 | 10/2018 | Gruhlke et al. |
| 10,597,580 B2 | 3/2020 | Min et al. |
| 10,686,159 B2 | 6/2020 | Ma et al. |
| 10,988,685 B2 | 4/2021 | Ahn et al. |
| 2015/0028291 A1 | 1/2015 | Choi et al. |

FOREIGN PATENT DOCUMENTS

| | | | |
|---|---|---|---|
| CN | 105060273 A | 11/2015 | |
| CN | 105070849 A | 11/2015 | |
| CN | 105098075 A | 11/2015 | |
| CN | 105374953 A | 3/2016 | |
| CN | 105720205 A | 6/2016 | |
| CN | 105940081 A | 9/2016 | |
| CN | 106118242 A | 11/2016 | |
| CN | 106206972 A | 12/2016 | |
| CN | 106299150 A | 1/2017 | |
| CN | 106381140 A | 2/2017 | |
| CN | 106531860 A | 3/2017 | |
| CN | 106549111 A | 3/2017 | |
| CN | 106711309 A | 5/2017 | |
| CN | 106784191 A | 5/2017 | |
| CN | 107022354 A | 8/2017 | |
| CN | 107342374 A | 11/2017 | |
| CN | 108075043 A1 | 5/2018 | |
| CN | 108102640 A | 6/2018 | |
| CN | 108539054 A | 9/2018 | |
| CN | 108737131 A | 11/2018 | |
| IN | 108232023 A | 6/2018 | |
| KR | 101546622 B1 | 8/2015 | |
| KR | 20180090475 A | 8/2018 | |

OTHER PUBLICATIONS

Written Opinion for International Application No. PCT/CN2019/106137; Application Filing Date: Sep. 17, 2019; dated Nov. 29, 2019, 4 pages.

* cited by examiner

QLED AND MANUFACTURING METHOD THEREOF

CROSS REFERENCE TO RELATED APPLICATIONS

This application is a national phase entry of International Application No. PCT/CN2019/106137, filed on Sep. 17, 2019, which is based upon and claims priority to Chinese Patent No. 201811639181.7, filed on Dec. 29, 2018, the entire contents each of which are incorporated herein by reference.

TECHNICAL FIELD

The present application relates to the field of display technologies, and particularly relates to a QLED and a manufacturing method thereof.

BACKGROUND

Quantum dots, also referred to as semiconductor nanocrystals, have three-dimensional dimensions in a nanometer range (from 1 nm to 100 nm), and are a kind of nanoparticle theory between bulk materials and molecules. Quantum dots are provided with excellent optical properties such as high quantum yield, large molar extinction coefficient, good light stability, narrow half-peak width, wide excitation spectrum and controllable emission spectrum etc., and are very suitable for use as a luminescent material for light-emitting devices. In recent years, quantum dot fluorescent materials have been widely used in the field of pad displays due to their advantages such as high light and color purity, adjustable luminous colors, and long service life etc., thereby becoming an extremely promising next-generation display and solid-state lighting source. QLED (Quantum Dot Light Emitting Diode) is a light emitting device on the condition that the quantum dot material is used as the luminescent material, and it has become a strong competitor in the display technologies of a next generation due to its advantages such as adjustable wavelength, narrow emission spectrum, high stability, and high electroluminescence quantum yield, etc However, the current QLEDs and manufacturing methods thereof still need to be improved.

SUMMARY

The inventors have founded that in a process of manufacturing a QLED device by a solution method, due to material differences between respective functional layers, there will inevitably a certain compatibility problem between adjacent layers, especially there is a severe compatibility problem between a quantum dot light emitting layer and an electron transport layer (especially a zinc oxide layer) adjacent thereto. The poorly compatible quantum dot light emitting layer and the electronic functional layer (especially the zinc oxide layer) are easy to form a bulge at their interface, which affects film-forming performance of the device, thereby affecting the luminous efficiency of the QLED. At present, in order not to affect the stability of an underlying film layer, the QLED devices generally use inks with large polarities, as such most of these inks form interface deformation due to surface tension during film formation, which is not conducive to the uniform film formation, thus a leakage current of the device is larger, service life of the device is short, thereby leading an ohmic resistance value of the device increasing and efficiency of the device decreasing.

An objective of embodiments of the present application is to provide a QLED and a manufacturing method thereof, which are aimed to solve the problem that ink with a polarity largely different from a polarity of quantum dot ink is used to prepare the functional layer during the current QLED manufacturing process, thereby easily forming interface deformation due to surface tension during the film forming process, and affecting the performance of the device (service life and luminous efficiency).

Technical solutions adopted by embodiments of the present application are as follows.

A first aspect provides a QLED manufacturing method, which includes following steps of:

providing a substrate provided with a bottom electrode, and preparing a quantum dot light emitting layer on the substrate provided with the bottom electrode;

illuminating after depositing a first compound solution on a surface of the quantum dot light emitting layer, wherein a first compound in the first compound solution is a compound capable of being photodegraded into ions after the illumination.

In an embodiment, the first compound is selected from one or more of a diphenyliodonium compound and an 1,2,3,4-thiatriazole-5-sulfhydryl compound.

In an embodiment, the diphenyliodonium compound is selected from at least one of $(Ph2I)4Sn2S6$, $(Ph2I)2CdCl4$ and $(Ph2I)2MoO4$; and/or the 1,2,3,4-thiatriazole-5-sulfhydryl compound is selected from at least one of $NH4CS2N3$, $NaCS2N3$ and $LiCS2N3$.

In an embodiment, a solvent in the first compound solution is selected from one or more of a group including mercaptans with a carbon atom number less than 20 in a straight chain, olefins with a carbon atom number less than 20 in a straight chain, alcohols and their derivatives with a carbon atom number less than 20 in a straight chain, and organic esters with a carbon atom number less than 20.

In an embodiment, the mercaptan with the carbon atom number less than 20 in the straight chain is selected from one or more of a group comprising butyl mercaptan, amyl mercaptan, heptyl mercaptan, octyl mercaptan, and n-octadecyl mercaptan;

the olefin with the carbon atom number less than 20 in the straight chain is selected from one or more of hexene, 4-octene, 5-decene, 5-methyl-5-decene, and octadecene;

the alcohol and its derivatives with the carbon atom number less than 20 in the straight chain are selected from one or more of methoxyethanol, ethoxyethanol, and phenoxyethanol;

the organic ester with the carbon atom number less than 20 is selected from one or more of methyl acrylate, butyl acetate, and methyl benzoate.

In an embodiment, based on a total weight of the first compound solution being 100%, a mass percentage of the first compound is between 0-10%, and is not equal to 0.

In an embodiment, based on the total weight of the first compound solution being 100%, the mass percentage of the first compound is between 2%-8%.

In an embodiment, the bottom electrode is an anode, and a solution method is used to prepare the quantum dot light emitting layer on the substrate provided with the bottom electrode, the illumination is performed after depositing the first compound solution on the surface of the quantum dot light emitting layer, an electron transport layer is prepared by the solution method on the surface of the illuminated quantum dot light emitting layer, and a layer of the ions is covered on the surface of the quantum dot light emitting layer.

In an embodiment, a light source applied in the illumination is selected from ultraviolet light with a light emitting wavelength between 100 nm-400 nm and/or visible light with a light emitting wavelength between 400 nm-500 nm; and/or illuminance of a light source applied in the illumination is between 2000 lx-10000 lx; and/or time of the illumination lasts between 10 minutes to 60 minutes.

A second aspect provides a QLED, which includes:
a bottom electrode and a top electrode;
a quantum dot light emitting layer arranged between the bottom electrode and the top electrode;
a layer of ions covered on a surface of the quantum dot light emitting layer facing toward the top electrode.

In an embodiment, the ions are prepared from a first compound after the first compound is subjected to illumination, wherein the first compound is a compound photodegradable into ions after the illumination.

In an embodiment, the first compound is selected from at least one of a diphenyliodonium compound and an 1,2,3,4-thiatriazole-5-sulfhydryl compound.

In an embodiment, the diphenyliodonium compound is selected from at least one of $(Ph2I)4Sn2S6$, $(Ph2I)2CdCl4$, $(Ph2I)2MoO4$; and/or the 1,2,3,4-thiatriazole-5-sulfhydryl compound is selected from at least one of $NH4CS2N3$, $NaCS2N3$, and $LiCS2N3$.

In an embodiment, the surface of the quantum dot light emitting layer facing toward the top electrode is covered with one layer of the ions with a thickness between 0.001 nm to 1 nm.

In an embodiment, the QLED has a positive structure, the bottom electrode is an anode, the top electrode is a cathode, the quantum dot light emitting layer is laminated and bonded with an electron transport layer, and an interface through which the quantum dot light emitting layer is bonded with the electron transport layer is covered with one layer of the ions.

The beneficial effects of the QLED manufacturing method provided by the embodiments of the present application lie in that: after the first compound solution is deposited on the side of the quantum dot light emitting layer (facing toward the top electrode), the illumination is performed. The first compound is converted into ions with a larger polarity under the illumination condition, so that the contact angle of the solution deposited on the surface of the ions becomes smaller when the other functional layer is prepared on the side of the ions facing away from the bottom electrode, so as to form the other functional layer with a flat film, thereby improving the compatibility between the quantum dot light emitting layer and the other functional layer, and improving the luminous efficiency of the QLED.

The beneficial effects of the QLED provided by the embodiments of the present application lie in that: the surface of the quantum dot light emitting layer facing toward the top electrode is covered with the ions, which is beneficial to improve the flatness of the other functional layer prepared on the side facing away from the bottom electrode, thereby improving the luminous efficiency of the QLED.

DESCRIPTION OF THE DRAWINGS

In order to more clearly illustrate the technical solutions in the embodiments of the present application, drawings needed to be used in description for the embodiments or exemplary technologies will be briefly introduced below. Obviously, the drawings in the following description are only some embodiments of the present application, and other drawings may be obtained by those of ordinary skill in the art based on these drawings without creative work.

DETAILED EMBODIMENTS

In order to make the objectives, technical solutions, and advantages of the present application more comprehensible, the present application is further described in detail below with reference to the accompanying drawings and embodiments. It should be understood that the specific embodiments described herein are only used to explain the present application, and are not aimed to limit the present application.

It should be noted that the terms "first" and "second" are only used for a descriptive purpose, and cannot be understood as an indication or implication of relative importance or an implicit indication of the number of a specific technical feature. Therefore, the features defined with "first" and "second" may explicitly or implicitly include one or more of these features. In the description of the present application, "plurality" means two or more than two, unless otherwise specifically defined.

In order to illustrate the technical solutions of the present application, the present application will be described in detail below in conjunction with specific drawings and embodiments.

Figure 1:
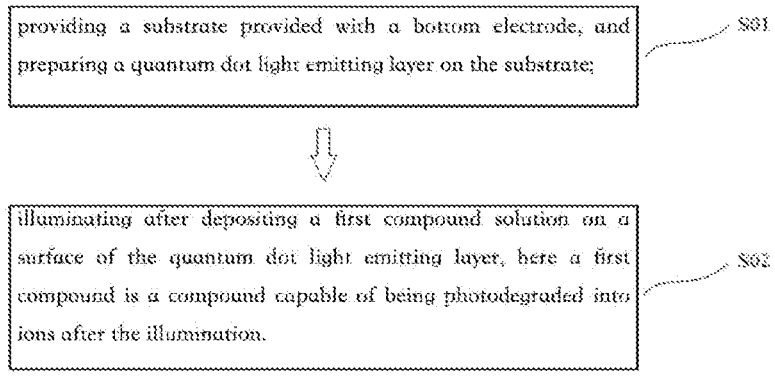
FIG. 1 is a schematic diagram of a QLED manufacturing method provided by an embodiment of the present application.

As shown in FIG. 1, some embodiments of the present application provide a QLED manufacturing method, which includes following steps of:

at a step S01, providing a substrate provided with a bottom electrode, and preparing a quantum dot light emitting layer on the substrate;

at a step S02, performing illumination after depositing a first compound solution on a surface of the quantum dot light emitting layer, here the first compound is a compound capable of being photodegraded into ions after the illumination.

In the QLED manufacturing method provided in the present application, after the first compound solution is deposited on one side of the quantum dot light emitting layer (facing toward the top electrode), the illumination is performed. The first compound is converted into ions with larger polarities under the illumination conditions, so that a contact angle of the solution deposited on the surface of the ions becomes smaller to form other functional layers with flat films when the other functional layers are prepared on the side of the ions facing away from the bottom electrode, thereby improving the compatibility between the quantum dot light emitting layer and the other functional layers, and improving the luminous efficiency of the QLED.

The QLEDs are classified into QLEDs with a positive structure and QLEDs with an inverse structure. In some embodiments, the QLED with the positive structure includes a substrate, a bottom electrode, a quantum dot light emitting layer, an electron transport layer and a top electrode laminatedly arranged from the bottom to the top. For the QLED with the positive structure, the bottom electrode provided on the substrate is an anode. In an implementation of the present application, the substrate may include a substrate, a bottom electrode laminatedly arranged on a surface of the substrate, a hole injection layer laminatedly arranged on a surface of the bottom electrode, and a hole transport layer laminatedly arranged on a surface of the hole injection layer; in another implementation of the present application, the substrate may include a substrate, a bottom electrode laminatedly arranged on a surface of the substrate, and a hole transport layer laminatedly arranged on a surface of the bottom electrode. In another implementation of the present application, the substrate may include a substrate, a bottom electrode laminatedly arranged on a surface of the substrate, a hole injection layer laminatedly arranged on a surface of the bottom electrode, a hole transport layer laminatedly arranged on a surface of the hole injection layer, and an electron blocking layer laminatedly arranged on a surface of the hole transport layer.

In some embodiments, the QLED with the inverted structure may include a substrate, a bottom electrode, a quantum dot light emitting layer, and a top electrode laminatedly arranged from bottom to top. For the QLED with the inverted structure, the bottom electrode provided on the substrate is a cathode. In an implementation of the present application, the substrate may include a substrate, a bottom electrode laminatedly arranged on a surface of the substrate, and an electron transport layer laminatedly arranged on the surface of the substrate. In another implementation of the present application, the substrate may include a substrate, a bottom electrode laminatedly arranged on a surface of the substrate, an electron injection layer laminatedly arranged on a surface of the bottom electrode, and an electron transport layer laminatedly arranged on a surface of the electron injection layer. In still another implementation of the present application, the substrate may include a substrate, a bottom electrode laminatedly arranged on a surface of the substrate, an electron injection layer laminatedly arranged on the surface of the substrate, an electron transport layer laminatedly arranged on a surface of the electron injection layer, and a hole blocking layer laminatedly arranged on a surface of the electron transport layer.

Specifically, in the above step S01, the substrate provided with the bottom electrode is provided, that is, the bottom electrode is provided on the substrate. The selection of the substrate is not strictly limited, and the substrate may adopt a hard substrate such as a glass substrate, or may adopt a flexible substrate such as a polyimide substrate, a polynorbornene substrate etc., but it is not limited thereto. The bottom electrode is an electrode opposite to the top electrode, and the bottom electrode may be a cathode or an anode. Specifically, when the bottom electrode is an anode, the top electrode is a cathode; when the bottom electrode is a cathode, the top electrode is an anode.

The deposition of quantum dot ink on the bottom electrode is preferably achieved by an inkjet printing method. Here, the quantum dot ink includes an organic solvent and quantum dots dispersed in the organic solvent. The quantum dots are conventional quantum dots in the art, and a surface of the quantum dots usually contains an organic ligand. In an embodiment of the present application, the organic solvent used to disperse the quantum dots is a conventional main solvent, which is usually a non-polar solvent, including but not limited to toluene, n-heptane, n-hexane, chloroform, dichloromethane, cyclohexane and trichloroethylene.

In the above step S02, the first compound is dispersed in the organic solvent to prepare the first compound solution, here the first compound can be converted into ions with a larger polarity after illuminated. In some embodiments, the first compound is selected from at least one of a diphenyliodonium compound and an 1,2,3,4-thiatriazole-5-mercapto salt compound. As shown in the following reaction formula, the diphenyliodonium compound and 1,2,3,4-thiatriazole-5-mercapto salt compound can be converted into substances with enhanced polarity under the illumination condition to improve the polarity of the solution system, thereby facilitating decrease of the contact angle of the surface during deposition and improvement of the flatness of the films. Moreover, the substance converted by the first compound through the illumination does not interfere with the light emission of the QLED.

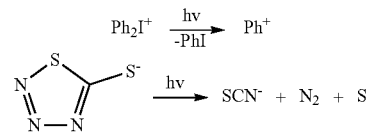

In some embodiments, the diphenyliodonium compound is selected from at least one of $(Ph_2O_4Sn_2S_6)$, $(Ph_2I)_2CdCl_4$, $(Ph_2I)_2MoO_4$. In some embodiments, the 1,2,3,4-thiatriazole-5-mercapto salt compound is selected from at least one of $NH_4CS_2N_3$, $NaCS_2N_3$, and $LiCS_2N_3$. The type of the first compound is specifically listed in the above embodiments.

In some of the embodiments of the present application, the solvent in the first compound solution is selected from one or more of a group consisting of mercaptans with a carbon atom number less than 20 in a straight chain, olefins with a carbon atom number less than 20 in a straight chain, alcohols and their derivatives with a carbon atom number less than 20 in a straight chain, and organic esters with a carbon atom number less than 20. The above-mentioned types of organic solvents can not only effectively dissolve the first compound to form the uniform first compound solution, but also have better dispersion performance for the ions with enhanced polarities converted by the first compound after illumination, thereby facilitating the formation of the complete and uniform films.

In some embodiments of the present application, the mercaptan with the carbon atom number less than 20 in the straight chain is selected from a group consisting of butyl mercaptan, amyl mercaptan, heptyl mercaptan, octyl mercaptan, and n-octadecyl mercaptan. In some embodiments of the present application, the olefin with the carbon atom number less than 20 in the straight chain is selected from hexene, 4-octene, 5-decene, 5-methyl-5-decene, and octadecene. In some embodiments of the present application, the alcohol and its derivatives with the carbon atom number less than 20 in the straight chain are selected from methoxyethanol, ethoxyethanol, and phenoxyethanol. In some embodiments of the present application, the organic ester with the carbon atom number less than 20 is selected from methyl acrylate, butyl acetate, and methyl benzoate.

In some embodiments, based on the total weight of the first compound solution being 100%, a mass percentage of the first compound ranges from 0 to 10%, but is not equal to 0. The content of the first compound is within the above range, which is beneficial for covering a layer of ions by controlling the thickness of the deposited solution, thereby improving the deposition effect of materials of other functional layers deposited subsequently. As the content of the first compound increases, the controllable thickness of the formed ions becomes larger. When the amount percentage of the first compound exceeds 10%, the thickness of the formed ions is too thick, which affects the transport performance of carriers and affects the luminous efficiency of the QLED. In some embodiments of the present application, based on a total weight of the first compound solution being 100%, the mass percentage of the first compound ranges from 2% to 8%.

In some embodiments, a solution method is used to form the quantum dot light emitting layer, and then one layer of the ions is formed on the surface of the quantum dot light emitting layer, and other functional layers are formed on the surface of this one layer of the ions. The first compound is converted into irons with larger polarities under the illumination condition, such that the contact angle of the solution deposited on the surface of the ions becomes smaller when a solution processing method is used to prepare other functional layers on a side of the ions facing away from the bottom electrode, so as to form the other functional layers with flat films, thereby improving the compatibility between the quantum dot light emitting layer prepared and other functional layers by the solution method, and improving the luminous efficiency of the QLED.

In some embodiments, a light source applied in the illumination is selected from ultraviolet light with an emission wavelength of 100-400 nm and/or visible light with an emission wavelength of 400-500 nm. Under the conditions of ultraviolet and/or visible light illumination, the first compound that is sensitive to light undergoes a chemical change and is converted into a substance with a larger polarity, which facilitates spreading of solutions of materials of other functional layers and reducing the contact angles of solutions of materials of the other functional layers on surfaces of the ions, thereby improving the flatness of the films of the QLED. In some embodiments of the present application, the light source applied in the illumination is selected from ultraviolet light with a wavelength of 100-400 nm, which is more conducive to the conversion of the first compound into a substance with a larger polarity.

In an embodiment of the present application, the illumination intensity has a certain influence on the functional layers of the QLED. In some embodiments, the first compound solution deposited on the surface of the quantum dot light emitting layer is subjected to illumination under a condition that illuminance of the light source applied in the illumination is from 500 lx to 50000 lx. If the illuminance is too high, the formed functional materials such as the quantum dot light emitting materials and the materials of other functional layers (a hole transport material, a hole injection material, an electron transport material, an electron injection material) will be affected to some extent, thereby reducing the service life of the QLED; if the illuminance is too low, the conversion effect of the first compound is not obvious. In some embodiments of the present application, the first compound solution deposited on the surface of the quantum dot light emitting layer is subjected to the illumination under a condition that the illuminance of the light source applied in the illumination is from 2000 lx to 10000 lx.

On this basis, the first compound solution deposited on the surface of the quantum dot light emitting layer is subjected to the illumination for from 10 minutes to 60 minutes, which can reduce the contact angle of the quantum dot ink on the surface of the electron transport layer. The time of the illumination is adjusted according to change of the illumination intensity, the stronger the illumination intensity, the shorter the time of the illumination; the weaker the illumination intensity, the longer the time of the illumination.

After the first compound subjected to the illumination is converted into ions, a drying operation is performed. In some embodiments of the present application, the film is formed by means of vacuum drying.

In an embodiment of the present application, the thickness of one layer of the ions is between 0.001 nm-1 nm, so as to prevent excessively thick ions from affecting the luminous efficiency of the QLED.

In the above step S03, since one layer of ions with a larger polarity is formed on the surface of the quantum dot light emitting layer, the contact angle of the material solution of the other functional layer on the surface of the ions becomes smaller when the material solution of the other functional layer with a polarity largely different from a polarity of the quantum dot ink is deposited on a side of the ions facing away from the bottom electrode, which is more conducive to forming a flat film, thereby improving the luminous efficiency of the QLED.

In some embodiments, the other functional layer is an electronic functional layer. In this case, the top electrode is an anode and the bottom electrode is a cathode. The electron functional layer includes at least one of the electron injection layer, the electron transport layer, and the hole blocking layer. Among them, the electron injection layer and the electron transport layer are configured to reduce the difficulty of electron injection, and the hole blocking layer is configured to block excess holes so that the excess holes are of capable of reaching the cathode to form a leakage current, thereby improving current efficiency of the QLED. In some specific embodiments, when the top electrode is an anode and the bottom electrode is a cathode, an electron transport material solution is deposited on the surface of one layer of the ions to prepare the electron transport layer.

In some embodiments, the other functional layer is a hole functional layer. In this case, the top electrode is a cathode and the bottom electrode is an anode. The hole functional layer includes at least one of a hole injection layer, a hole transport layer, and an electron blocking layer. Among them, the hole injection layer and the hole transport layer are configured to reduce the difficulty of hole injection, and the electron blocking layer is configured to block excess electrons so that the excess electrons are not capable of reaching the anode to form a leakage current, thereby improving current efficiency of the QLED. As a specific preferred embodiment, when the top electrode is a cathode and the bottom electrode is a cathode, a hole transport material solution is deposited on the surface of one layer of the ions to prepare the hole transport layer.

The first compound solution is deposited on the side of the quantum dot light emitting layer facing away from the bottom electrode and then the illumination is performed. The first compound changes under the illumination and forms ions with a larger polarity after the solvent is removed, so as to cover one layer of irons on the quantum dot light emitting layer, thereby reducing the contact angle of the material solution of other functional layer deposited subsequently on the surface of the ions, improving the flatness of the other functional layer, and improving the luminous efficiency of the QLED. In some specific implementations, the QLED is a QLED with a positive structure, which includes a substrate, a bottom electrode, a quantum dot light emitting layer, an electron transport layer arranged on a surface of the quantum dot light emitting layer, and a top electrode laminatedly arranged from bottom to top. Regarding the QLED with the positive structure, the bottom electrode provided on the substrate is an anode. In an embodiment of the present application, the substrate may include a substrate, a bottom electrode laminatedly arranged on a surface of the substrate, a hole injection layer laminatedly arranged on a surface of the bottom electrode, and a hole transport layer laminatedly arranged on a surface of the hole injection layer. In another implementation of the present application, the substrate may include a substrate, a bottom electrode laminatedly arranged on a surface of the substrate, and a hole transport layer laminatedly arranged on a surface of the bottom electrode. In still another implementation of the present application, the substrate may include a substrate, a bottom electrode laminatedly arranged on a surface of the substrate, a hole injection layer laminatedly arranged on a surface of the bottom electrode, a hole transport layer laminatedly arranged on a surface of the hole injection layer, and an electron blocking layer laminatedly arranged on a surface of the hole transport layer. In yet another implementation of the present application, the electron transport material is selected from any one or more than two of a combination including $ZnO$, $TiO_2$, $SnO$, $ZrO_2$, $Ta_2O_3$, $ZnSnO$ and $InSnO$, and n-type semiconductor nanoparticles.

As a preferred embodiment, the bottom electrode is an anode, the top electrode is a cathode, and the other functional layer is an electron transport layer. In some embodiments of the present application, the electron transport layer is a layer of n-type nano zinc oxide. When the other functional layer is one layer of n-type nano-zinc oxide, the layer of n-type nano-zinc oxide is originally prone to deform at an interface during the film formation process due to large differences in polarities, however, the layer of n-type nano-zinc oxide can be spread better after being modification of the ions, and the contact angle is effectively reduced, thereby significantly improving the film-forming performance of the layer of the n-type nano-zinc oxide.

In some embodiments of the present application, the top electrode is prepared on a side of the other functional layer facing away from the bottom electrode, which may be prepared by a conventional method in the art. It is worth noting that the top electrode described in the embodiments of the present application is an electrode opposite to the bottom electrode, which specifically may be an anode or a cathode.

Moreover, some embodiments of the present application provide a QLED, which includes:

a bottom electrode and a top electrode oppositely arranged, here the bottom electrode is an anode, and the top electrode is a cathode; or the bottom electrode is a cathode, and the top electrode is an anode;

a quantum dot light emitting layer arranged between the bottom electrode and the top electrode;

a layer of ions covered on a surface of the quantum dot light emitting layer facing toward the top electrode.

In the QLED provided by an embodiment of the present application, an interface between the quantum dot light emitting layer and the other functional layer is covered with one layer of ions, which is beneficial to improve the flatness of the film of the other functional layer, thereby improving the luminous efficiency of the QLED.

The QLED described in the embodiments of the present application can be prepared by the methods described above.

Specifically, the bottom electrode and the top electrode are arranged opposite to each other, with one being an anode and the other being a cathode. When the bottom electrode is an anode, the top electrode is a cathode; when the bottom electrode is a cathode, the top electrode is an anode. The top electrode or the bottom electrode may be disposed on a substrate to form an electrode substrate.

The quantum dot light emitting layer is arranged between the bottom electrode and the top electrode to form a most basic QLED. The quantum dots are conventional quantum dots in the art, and a surface of the quantum dots usually contains an organic ligand. In some embodiments, the thickness of the quantum dot light emitting layer is between 30 nm-50 nm.

In an embodiment of the present application, a functional layer is provided on the basis of the basic structure of the QLED. The functional layer includes at least other functional layer arranged between the quantum dot light emitting layer and the bottom electrode. The other functional layer may be an electronic functional layer or a hole functional layer, which depends on the types of the bottom electrode and the top electrode. The electronic functional layer is disposed between the cathode and the quantum dot light emitting layer, and includes at least one of an electron injection layer, an electron transport layer, and a hole blocking layer. In some embodiments, the material of the electron injection layer may be a conventional electron hole injection material, which includes but is not limited to LiF and CsF, and the thickness of the electron transport layer is between 10 nm-100 nm. The material of the electron transport layer may be a conventional electron transport material, which includes but is not limited to n-type zinc oxide, and the thickness of the electron transport layer is between 10 nm-100 nm.

The hole functional layer is disposed between the anode and the quantum dot light emitting layer, and includes at least one of a hole injection layer, a hole transport layer, and an electron blocking layer. In some embodiments, the hole injection layer may be made of a conventional hole injection material, including but not limited to PEDOT:PSS. The hole transport layer may be made of a conventional hole transport material, including but not limited to an organic material such as NPB and TFB, an inorganic material such as NiO and $MoO_3$, and composites thereof. The thickness of the hole transport layer is between 10 nm-100 nm.

In particular, in the embodiments of the present application, one layer of ions is arranged between the quantum dot light emitting layer and the other functional layer. The ions are obtained after the first compound is subjected to illumination, and the first compound may be converted into ions with a larger polarity after the illumination. The ions are used to modify the interface of the quantum dot light emitting layer, so that the contact angle of the material solution of the other functional layer on the solid surface of the lower layer is decreased when the solution processing method is used to prepare other functional layers with large differences in polarity, thereby forming the interface with less deformation and other functional layers with higher flatness.

In some embodiments of the present application, the first compound is selected from a modified material formed after at least one of azobenzene and its derivatives, a diphenyliodonium compound, a sulfonium compound, an 1,2,3,4-thiatriazole-5-sulfhydryl compound is illuminated.

In some embodiments of the present application, the diphenyliodonium compound is selected from at least one of (Ph2O4Sn2S6, (Ph2O2CdCl4, (Ph2I)2MoO4; the 1,2,3,4-thiatriazole-5-sulfhydryl compound is selected from at least one of $NH_4CS_2N_3$, NaCS2N3, and LiCS2N3.

In some of the embodiments of the present application, the thickness of the ions is between 0.001 nm to 1 nm to prevent excessively thick ions from affecting the transmission efficiency of the carriers, thereby affecting the luminous efficiency of the QLED.

On the basis of the foregoing embodiments, a second functional layer is provided between the quantum dot light emitting layer and the top electrode. The second functional layer may be an electronic functional layer or a hole functional layer, which depends on the types of the bottom electrode and the top electrode. When the top electrode is an anode, the second functional layer is a hole functional layer, and the hole functional layer includes at least one of a hole injection layer, a hole transport layer, and an electron blocking layer. When the top electrode is a cathode, the second functional layer is an electronic functional layer, and the electronic functional layer includes at least one of an electron injection layer, an electron transport layer, and a hole blocking layer.

The description will be given below in conjunction with specific embodiments.

First Embodiment

A QLED manufacturing method includes following steps of:

providing an ITO anode glass substrate, preparing a hole injection layer (PEDOT:PSS) on the ITO anode glass substrate, preparing a hole transport layer (TFB) on the hole injection layer, and preparing a quantum dot light emitting layer on the hole transport layer (CdSe/ZnS QDs);

preparing a tert-butanol solution with a mass percentage of $(Ph2I)_4Sn_2S_6$ being 5%, illuminating using ultraviolet light with a wavelength of 270 nm for 10 minutes after depositing the tert-butanol solution with $(Ph2I)_4Sn_2S_6$ on a side of the quantum dot light emitting layer facing away from the bottom electrode, and vacuum drying to form a film so as to prepare ions;

depositing ZnO ink on a side of the ions facing away from the anode to prepare an electron transport layer, preparing an electron injection layer (LiF) on a side of the electron transport layer facing away from the anode, and preparing a cathode (aluminum) on a side of the electron injection layer facing away from the anode.

Second Embodiment

A QLED manufacturing method is the same as the manufacturing method of the first embodiment, except that ethoxyethanol with a mass percentage of NH4CS2N3 being 5% is deposited on the side of the quantum dot light emitting layer facing away from the bottom electrode, and then it is illuminated using ultraviolet light with a wavelength of 270 nm for 10 minutes, and vacuum drying is perform to form a film to prepare ions.

Third Embodiment

A QLED manufacturing method is the same as the manufacturing method of the first embodiment, except that a methyl benzoate solution with a mass percentage of the azobenzene being 5% is deposited on the side of the quantum dot light emitting layer facing away from the bottom electrode, and then it is illuminated using ultraviolet light with a wavelength of 270 nm for 10 minutes, and vacuum drying is perform to form a film to prepare ions First Comparative Example A QLED manufacturing method includes following steps of:

providing an ITO anode glass substrate, preparing a hole injection layer (PEDOT:PSS) on the ITO anode glass substrate, preparing a hole transport layer (TFB) on the hole injection layer, and preparing a quantum dot light emitting layer on the hole transport layer (CdSe/ZnS QDs);

depositing ZnO ink on a side of the quantum dot light emitting layer facing away from the anode to prepare an electron transport layer, preparing an electron injection layer (LiF) on a side of the electron transport layer facing away from the anode, and preparing a cathode (aluminum) on a side of the electron injection layer facing away from the anode.

Figure 2:
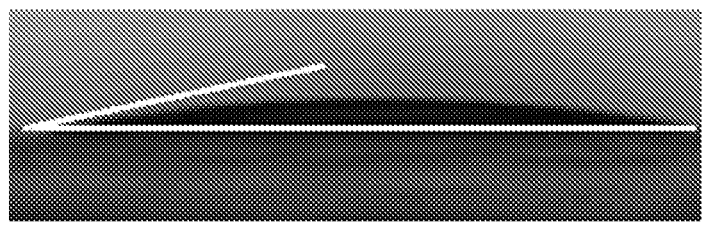
FIG. 2 is a schematic diagram of a contact angle of ZnO ink provided by a first embodiment of the present application.
Figure 3:
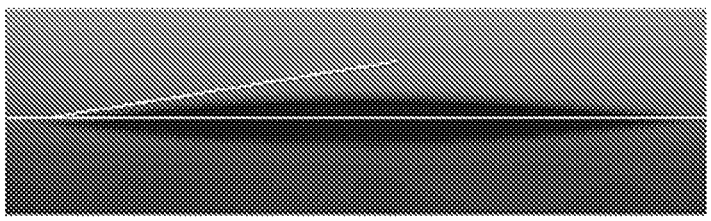
FIG. 3 is a schematic diagram of a contact angle of ZnO ink provided by a second embodiment of the present application.
Figure 4:
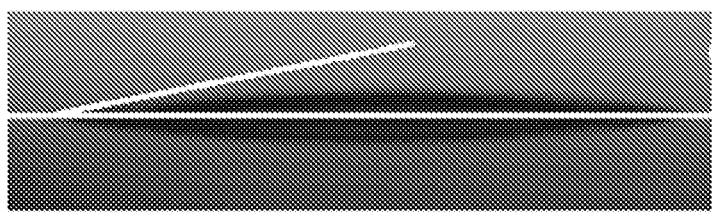
FIG. 4 is a schematic diagram of a contact angle of ZnO ink provided by a third embodiment of the present application.
Figure 5:
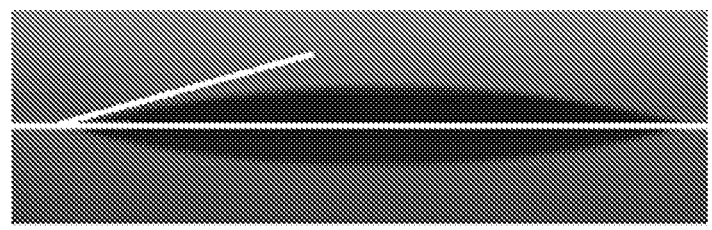
FIG. 5 is a schematic diagram of a contact angle of ZnO ink provided by a first comparative example.

After the ZnO inks were deposited in the first, second and third embodiment and the first comparative example, the contact angles were tested. The schematic diagram of the contact angle of the ZnO ink in the first embodiment is as shown in FIG. 2, and the contact angle is 9.5 degrees; the schematic diagram of the contact angle of the ZnO ink in the second embodiment is as shown in FIG. 3, and the contact angle is 9 degrees; the schematic diagram of the contact angle of the ZnO ink in the third embodiment is as shown in FIG. 4, and the contact angle is 10.5 degrees; the schematic diagram of the contact angle of the ZnO ink in the first comparative example is as shown in FIG. 5, and the contact angle is 15 degrees. It can be seen that the QLEDs prepared by the methods of the embodiments of the present application successfully reduce the contact angles between the quantum dot light emitting layer and the electron transport layer in the QLEDs.

Fourth Embodiment

A QLED manufacturing method includes following steps of:

providing an ITO anode glass substrate, preparing a hole injection layer (PEDOT:PSS) on the ITO anode glass substrate, preparing a hole transport layer (TFB) on the hole injection layer, and preparing a quantum dot light emitting layer on the hole transport layer (CdSe/ZnS QDs);

preparing a ethoxyethanol solution with a mass percentage of NH4CS2N3 being 5%, illuminating using ultraviolet light with a wavelength of 270 nm for 10 minutes after depositing the ethoxyethanol solution with NH4CS2N3 on a side of the quantum dot light emitting layer facing away from the bottom electrode, and vacuum drying to form a film so as to prepare ions;

depositing ZnO ink on a side of the ions facing away from the anode to prepare an electron transport layer, preparing an electron injection layer (LiF) on a side of the electron transport layer facing away from the anode, and preparing a cathode (aluminum) on a side of the electron injection layer facing away from the anode.

The 4 QLEDs prepared in the fifth embodiment and the 4 QLEDs prepared in the first comparative example are provided, respectively. The service life of the QLEDs prepared in the first comparative example and the QLEDs through vacuumizing for different time in the fifth embodiment is measured, and average values of the four groups of samples are obtained, the results of which are as shown in Table 1 below.

TABLE 1

| Number | Vacuumizing time for the device (h) | Average service life of the device without a modified layer (h) | Average service life of the device with a modified layer (h) |
|---|---|---|---|
| First comparative example | 0 | 240 | 270 |
| Fifth embodiment | 5 | 281 | 347 |
| | 10 | 350 | 359 |
| | 20 | 320 | 322 |

It can be seen from Table 1 that the service life of the QLED devices is improved to some extent after the interface of the quantum dot light emitting layer is modified by using the first compound of the embodiments of the present application, and vacuumizing for different time can further play a role of improving the working life of the device.

The above description has only described optional embodiments of the present application, and is not used to limit the present application. For those skilled in the art, the present application may have various modifications and changes, and any modification, equivalent replacement, improvement, etc. made within the spirit and principle of the present application shall be included in the scope of the claims of the present application.

What is claimed is:

1. A Quantum Dot Light Emitting Diode (QLED) manufacturing method, comprising following steps of:
   providing a substrate provided with a bottom electrode, and preparing a quantum dot light emitting layer on the substrate provided with the bottom electrode;
   illuminating after depositing a first compound solution on a surface of the quantum dot light emitting layer, wherein a first compound in the first compound solution is a compound capable of being photodegraded into ions after the illuminating.

2. The QLED manufacturing method according to claim 1, wherein the first compound is selected from one or more of a diphenyliodonium compound and an 1,2,3,4-thiatriazole-5-sulfhydryl compound.

3. The QLED manufacturing method according to claim 2, wherein the diphenyliodonium compound is selected from at least one of (Ph2I)4Sn2S6, (Ph2I)2CdCl4 and (Ph2I)2MoO4; and the 1,2,3,4-thiatriazole-5-sulfhydryl compound is selected from at least one of $NH_4CS_2N_3$, $NaCS_2N_3$ and $LiCS_2N_3$.

4. The QLED manufacturing method according to claim 1, wherein a solvent in the first compound solution is selected from one or more of a group comprising mercaptans with a carbon atom number less than 20 in a straight chain, olefins with a carbon atom number less than 20 in a straight chain, alcohols and their derivatives with a carbon atom number less than 20 in a straight chain, and organic esters with a carbon atom number less than 20.

5. The QLED manufacturing method according to claim 4, wherein the mercaptans with the carbon atom number less than 20 in the straight chain is selected from one or more of a group comprising butyl mercaptan, amyl mercaptan, heptyl mercaptan, octyl mercaptan, and n-octadecyl mercaptan.

6. The QLED manufacturing method according to claim 4, wherein the olefins with the carbon atom number less than 20 in the straight chain is selected from one or more of hexene, 4-octene, 5-decene, 5-methyl-5-decene, and octadecene.

7. The QLED manufacturing method according to claim 4, wherein the alcohols and their derivatives with the carbon atom number less than 20 in the straight chain are selected from one or more of methoxyethanol, ethoxyethanol, and phenoxy ethanol.

8. The QLED manufacturing method according to claim 4, wherein the organic ester with the carbon atom number less than 20 is selected from one or more of methyl acrylate, butyl acetate, and methyl benzoate.

9. The QLED manufacturing method according to claim 1, wherein based on a total weight of the first compound solution being 100%, a mass percentage of the first compound is between 0-10%, and is not equal to 0.

10. The QLED manufacturing method according to claim 9, wherein based on the total weight of the first compound solution being 100%, the mass percentage of the first compound is between 2%-8%.

11. The QLED manufacturing method according to claim 1, wherein the bottom electrode is an anode, and a solution method is used to prepare the quantum dot light emitting layer on the substrate provided with the bottom electrode, the illuminating is performed after depositing the first compound solution on the surface of the quantum dot light emitting layer, an electron transport layer is prepared by the solution method on the surface of the illuminated quantum dot light emitting layer, and a layer of the ions is covered on the surface of the quantum dot light emitting layer.

12. The QLED manufacturing method according to claim 1, wherein a light source applied in the illuminating is selected from ultraviolet light with a light emitting wavelength between 100 nm-400 nm and/or visible light with a light emitting wavelength between 400 nm-500 nm.

13. The QLED manufacturing method according to claim 1, wherein illuminance of a light source applied in the illumination is between 2000 lx-10000 lx.

14. The QLED manufacturing method according to claim 1, wherein time of the illuminating lasts between 10 minutes to 60 minutes.

15. A Quantum Dot Light Emitting Diode (QLED), comprising:
   a bottom electrode and a top electrode;
   a quantum dot light emitting layer arranged between the bottom electrode and the top electrode;
   a layer of ions covered on a surface of the quantum dot light emitting layer facing toward the top electrode.

16. The QLED according to claim 15, wherein the ions are prepared from a first compound after the first compound is subjected to illumination, wherein the first compound is a compound photodegradable into ions after the illumination.

17. The QLED according to claim 16, wherein the first compound is selected from at least one of a diphenyliodonium compound and an 1,2,3,4-thiatriazole-5-sulthydryl compound.

18. The QLED according to claim 17, wherein the diphenyliodonium compound is selected from at least one of (Ph2I)4Sn2S6, (Ph2I)2CdCl4, (Ph2I)2MoO4; and the 1,2,3,4-thiatriazole-5-sulfhydryl compound is selected from at least one of $NH_4CS_2N_3$, $NaCS_2N_3$, and $LiCS_2N_3$.

19. The QLED according to claim 15, wherein the surface of the quantum dot light emitting layer facing toward the top electrode is covered with one layer of the ions with a thickness between 0.001 nm to 1 nm.

20. The QLED according to claim 15, characterized in wherein the QLED has a positive structure, the bottom electrode is an anode, the top electrode is a cathode, the quantum dot light emitting layer is laminated and bonded with an electron transport layer, and an interface through which the quantum dot light emitting layer is bonded with the electron transport layer is covered with one layer of the ions.

* * * * *